(12) United States Patent
Otschik et al.

(10) Patent No.: US 9,010,762 B2
(45) Date of Patent: Apr. 21, 2015

(54) LOW-FRICTION SEAL RING WITH INEXPENSIVE DIAMOND COATING

(75) Inventors: Joachim Otschik, Aschaffenburg (DE); Andreas Schrüfer, Wolfratshausen (DE); Dieter Ziegenbein, Geretsried (DE); Rudolf Kollinger, Königsdorf (DE); Lothar Schäfer, Meine (DE); Markus Höfer, Gardessen (DE); Markus Armgardt, Braunschweig (DE)

(73) Assignee: EagleBurgmann Germany GmbH & Co. KG, Wolfratshausen (DE)

( * ) Notice: Subject to any disclaimer, the term of this patent is extended or adjusted under 35 U.S.C. 154(b) by 0 days.

(21) Appl. No.: 13/993,434

(22) PCT Filed: Oct. 4, 2011

(86) PCT No.: PCT/EP2011/004942
§ 371 (c)(1),
(2), (4) Date: Aug. 6, 2013

(87) PCT Pub. No.: WO2012/079658
PCT Pub. Date: Jun. 21, 2012

(65) Prior Publication Data
US 2013/0313785 A1    Nov. 28, 2013

(30) Foreign Application Priority Data
Dec. 17, 2010  (DE) .......................... 10 2010 054 875

(51) Int. Cl.
*F16J 15/20* (2006.01)
*F16J 15/16* (2006.01)
(Continued)

(52) U.S. Cl.
CPC ................ *F16J 15/16* (2013.01); *C23C 16/27* (2013.01); *F16J 15/3496* (2013.01)

(58) Field of Classification Search
CPC .......................... F16J 15/344; F16J 15/3496
USPC ......... 277/358, 404, 405, 406, 407, 935, 936, 277/940
See application file for complete search history.

(56) References Cited

U.S. PATENT DOCUMENTS 5,626,908 A    5/1997 Iio et al.
5,909,879 A *  6/1999 Simpson ....................... 277/399
(Continued)

FOREIGN PATENT DOCUMENTS

DE          3820581 A1    12/1989
DE     202006006425 U1     6/2006
(Continued)

OTHER PUBLICATIONS

Notice of Preliminary Rejection dated May 9, 2014 issued by the Korean Intellectual Property Office for KR Application No. 10-2013-7018307 and English Translation.

*Primary Examiner* — Gilbert Lee
(74) *Attorney, Agent, or Firm* — Locke Lord LLP; Scott D. Wofsy; Joshua L. Jones

(57) ABSTRACT

The present invention refers to a seal ring for a mechanical seal, comprising: a base body (2) with a diamond layer (3) which is applied to the base body (2) and configured as a sliding surface, wherein the diamond layer (3) has a thickness (D) which is less than or equal to 4 μm, particularly less than or equal to 3 μm, particularly less than or equal to 2 μm, particularly preferably about 1 μm, and wherein the base body (2) is without fissures or only comprises fissures that have a maximum longitudinal extension (L) on a surface of the base body (2) or in the base body (2) that is less than or equal to 5 μm.

24 Claims, 1 Drawing Sheet

Figure 1:
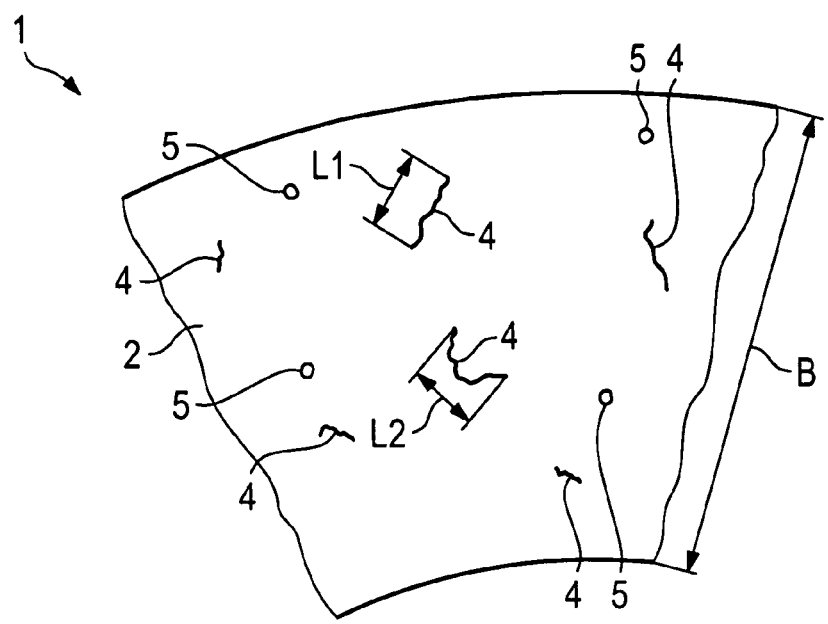

(51) Int. Cl.
*C23C 16/27* (2006.01)
*F16J 15/34* (2006.01)

(56) References Cited

U.S. PATENT DOCUMENTS

| | | | |
|---|---|---|---|
| 6,209,185 B1 * | 4/2001 | Scott | 29/458 |
| 6,319,439 B1 | 11/2001 | Lee et al. | |
| 7,793,940 B2 * | 9/2010 | Martin | 277/370 |
| 2007/0267820 A1 * | 11/2007 | Martin | 277/404 |

FOREIGN PATENT DOCUMENTS

| | | |
|---|---|---|
| DE | 202006009762 U1 | 8/2006 |
| DE | 202007016868 U1 | 2/2008 |
| JP | 2006275286 A | 10/2006 |

* cited by examiner

LOW-FRICTION SEAL RING WITH INEXPENSIVE DIAMOND COATING

CROSS-REFERENCE TO RELATED APPLICATIONS

This application is the national phase under 35 U.S.C. §371 of International Patent Application No. PCT/EP2011/004942 filed Oct. 4, 2011, which claims the benefit of European Patent Application No. 10 2010 054 875.8 filed Dec. 17, 2010, the entire contents of which are incorporated herein by reference.

The present invention refers to a low-friction seal ring which comprises an inexpensive diamond coating as a sliding surface. Furthermore, the present invention refers to a mechanical seal assembly including at least one seal ring according to the invention.

Seal rings with diamond coating are known from the prior art in different configurations. Owing to the diamond coating said seal rings have an extremely wear-resistant surface as well as excellent dry-running properties. Apart from the partly extremely high production costs, a drawback of such diamond-coated seal rings is also the problem that due to a poor bond between the diamond layer and the base body of the seal ring there may be detachments of the diamond layer with corresponding damage to the seal ring. To solve said problem, DE 20 2007 016 868.3 U1 has suggested a seal ring comprising a base body consisting of a two-component material, wherein a diamond material is introduced into the base body. Although this yields an improved bond between the base body and the diamond layer, such seal rings are even more expensive in their production for the reason that diamond is introduced as an additional material into the base body. Furthermore, DE 20 2006 006 425 U1 discloses a seal ring in the case of which a base body has applied thereto with corresponding efforts an additional substrate layer between the base body and the diamond layer. Furthermore, diamond-coated seal rings have the problem that the diamond layer may completely detach with parts of the base body.

It is therefore the object of the present invention to provide a seal ring with a diamond coating on the sliding surface, which, while being easily producible at low costs, provides a safe bond between base body and diamond coating also under extreme stresses.

This object is achieved with a slide ring comprising the features of claim 1. The sub-claims show preferred developments of the invention.

The seal ring according to the invention for a mechanical seal with the features of claim 1 has the advantage that it comprises a diamond layer on a sliding surface and thus has a long service life and particularly excellent dry-running properties. The production of the diamond layer is here very cost-effective as the diamond layer has only a thickness of less than or equal to 4 μm and there exists an excellent bond between the diamond layer and a base body. Especially the problem that has so far arisen in the prior art and regards the detachment of the diamond layer from the base body, especially together with parts of the base body, under high loads, e.g. high mechanical loads, can be avoided on the mechanical seal. This is achieved according to the invention in that the base body is without any fissures or only comprises fissures that have a maximum longitudinal extension that is smaller than or equal to 5 μm. It has been found according to the invention that in the absence of fissures or in the presence of only very small fissures on the surface and in the base body an adequate bond between the base body and the diamond layer can be ensured at every place. If the fissures become too large, there will be defects in the area of the fissures so that in these portions, especially under high loads, e.g. high mechanical loads, the diamond layer may detach with parts of the base body and the seal ring may get destroyed in the end. The longitudinal extension of the fissures of less than/equal to 5 μm is defined according to the invention such that a straight line which intersects two points of the fissure has a length of less than or equal to 5 μm at every possible point of intersection with the fissure between the intersection points. The limit of 5 μm according to the invention for the fissure length is here applicable to fissures on the surface and to fissures in the base body itself which, e.g. starting from the surface, run into the interior of the base body. Hence, according to the invention a base body, both on a surface where the diamond layer is applied and in the base body itself, is without any fissures or only shows fissures with a maximum longitudinal extension of ≤5 μm. To obtain e.g. a fissure size on a surface of the base body, as has been defined above, fine finishing of the surface, e.g. a polishing operation, is preferably carried out. Hence, it is possible according to the invention to provide a seal ring with a diamond coating of small thickness which can be produced at low costs and gives the seal ring extraordinary operating lives and dry-running properties. The diamond layer can here be deposited on the fissure-free base body or on the base body having only small fissures preferably by means of a CVD method. This offers an economically very great application potential because virtually all types of seal rings can be coated with diamond at low costs. A seal ring according to the invention has a very low friction coefficient and establishes a stable bond between diamond layer and base body. Preferably, a thickness of the diamond layer is less than 4 μm, preferably less than 3 μm, particularly preferably less than 2 μm, and the diamond layer thickness is particularly preferably about 1 μm. Furthermore, a fissure length of less than 3 μm and particularly preferably less than 1 μm is preferred, or there are no fissures at all.

Further preferably, a depth of the fissures, starting from the surface perpendicular to the surface, is less than or equal to 3 μm.

Further preferably, the thickness of the diamond layer is at least 0.5 μm. It is thereby ensured that the diamond layer offers adequate protection against aggressive or corrosive media with which the seal rings may get into contact.

According to a further preferred configuration of the present invention the surface of the base body is free of pores or preferably only comprises pores of a mean pore diameter of less than/equal to 0.4 mm, preferably less than/equal to 0.3 mm, particularly preferably less than/equal to 0.2 mm.

Further preferably, the pores are spaced apart in dependence upon the mean pore diameter by the factor 100 of the mean pore diameter. This means that when the mean pore diameter is 0.4 mm, a distance of said pore to a neighboring pore, starting from the respective edges of the pores, is at least 40 mm. According to the invention mean pore diameter means the diameter that corresponds to a maximum length of a straight line between two peripheral points through the pore since the pores are normally not circular.

According to a further preferred configuration of the invention a crystallite size of the diamond layer deposited as crystalline diamond is between 0.2-5 μm, particularly 0.2-4 μm, preferably, 0.2-3 μm, preferably 0.2-2.5 μm, further preferably 0.2-1 μm.

Further preferably, a roughness $R_a$ of the surface of the base body is less than/equal to 0.2 μm, particularly less than/equal to 0.15 μm, and particularly preferably less than/equal to 0.1 μm.

Preferably, an SP3 fraction in the diamond layer is greater than or equal to 97%.

According to a further preferred configuration of the invention the base body has a Vickers hardness of at least 1400 HV.

To achieve a service life that is as long as possible, a defect density in the diamond coating is of such a type that the ratio of the defect area to the defect-free coated area is less than or equal to $200 \times 10^{-9}$.

The base body is preferably made from a carbide material, particularly from silicon carbide (SiC) or tungsten carbide (WC), with minor amounts of additives and/or binding materials and/or impurities being possibly contained.

Further preferably, a surface of the diamond layer corresponds to a surface of the base body with a deviation of not more than ±0.2 μm.

A seal ring according to the invention may here be used in mechanical seals in the case of which both seal rings are formed with the diamond coating according to the invention. As an alternative, the seal ring according to the invention may also run against a non-coated seal ring, e.g. of silicon carbide.

Figure 2:
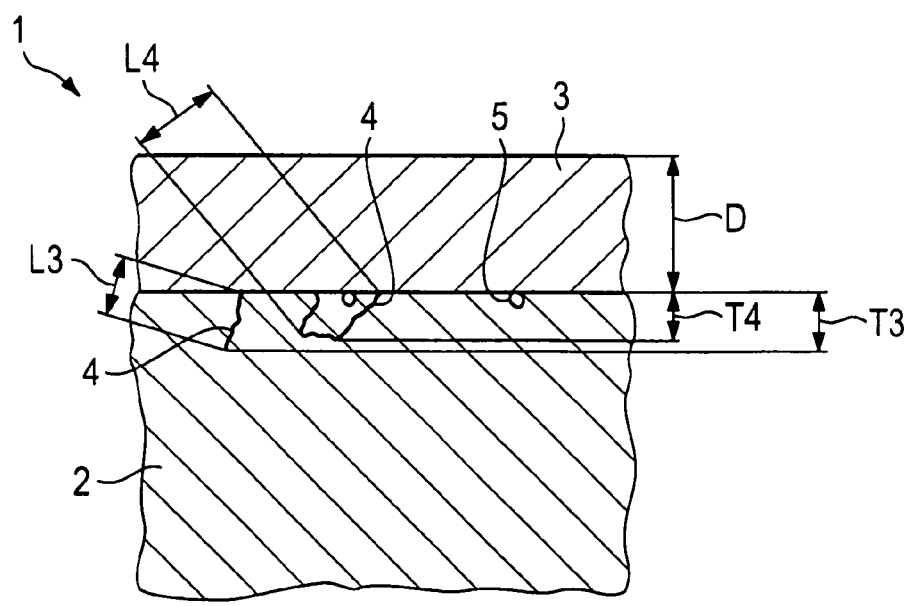

A preferred embodiment of the invention will now be described in detail with reference to the accompanying drawing, in which:

FIG. 1 is a schematic top view on a surface of a base body for a seal ring according to an embodiment of the invention; and FIG. 2 is a schematic sectional view through a seal ring according to the invention.

As can be seen in FIG. 2, the seal ring 1 comprises a base body 2 of SiC and a diamond layer 3 applied thereto. The diamond layer 3 has a thickness D of 1 μm. The diamond layer 3 is formed from crystalline diamond with a very great SP3 fraction of more than 97%.

FIG. 1 is a top view on a surface of the base body 2 before the application of the diamond layer. As can be seen in FIG. 1, a few fissures 4 are formed in the surface of the base body 2. The fissures 4, however, are formed such that they have a maximum longitudinal extension that is less than 5 μm. In FIG. 1, the maximum longitudinal extension L1 and L2, respectively, as found on the surface, is plotted for two fissures. The maximum longitudinal extension is here defined according to the invention as a maximum straight section which connects two points of the fissure 4 in a straight manner.

In the section of FIG. 2, two further fissures 4 are shown that have a maximum longitudinal extension L3 and L4, respectively, into the depth of the base body 2, each being less than 5 μm. As a consequence, the base body 2 according to the invention is provided on the surface and also in the body itself only with fissures 4 that have a maximum longitudinal extension of less than or equal to 5 μm. The longitudinal extension is defined by a straight line which intersects two arbitrary points of the fissure and has a length of less than or equal to 5 μm at every possible point of intersection of two points of the fissure. The fissure 4 as shown in FIG. 2 with the longitudinal extension L3 has here a depth T3 which is less than 3 μm. FIG. 2 shows a further fissure 4 with a longitudinal extension L4 and a depth T4 which begins at a first place of the surface, passes into the base body 2, and exits again at another place of the surface of the base body. It should here be noted that the fissure may also have a three-dimensional fissure area; in this case it extends on the surface of the base body 2 and also in the form of an area into the base body 2 itself.

Furthermore, plural pores 5 are formed on the surface of the base body 2. The pores 5 have an average diameter of less than or equal to 0.4 mm, the distance of neighboring pores being at least 100 times the pore diameter, i.e., in this embodiment 40 mm. The pore diameter is defined according to the invention as the longest straight line through two boundary points of the pores as the pores do normally not have a circular shape, but an uneven boundary region. The pores 5 have here a depth corresponding at the most to the diameter of the pores.

Furthermore, all fissures 4 have a depth T which is less than 3 μm. Moreover, the surface of the diamond layer corresponds to the surface of the base body with a deviation of not more than ±0.2 μm.

The crystalline diamond layer according to the invention is produced on the base body 2 in the following way. The seal ring to be coated is arranged in a vacuum container which is subsequently fed with methane and hydrogen. At a distance of a few centimeters above the seal rings to the coated, wires are tensioned; these are then heated up to white heat. The gas is thereby heated so that carbon is deposited on the surface of the base body 2 in a crystalline diamond form. A chemical bond between the diamond layer and the base body 2 is thereby formed. Due to the absence of fissures in the base body and due to the condition that only fissures on or in the base body are present that have a maximum longitudinal extension of less than or equal to 5 μm, it is possible to achieve a high interface stability.

With such a method a base body 2 of SiC was coated with diamond (Example 1). The base body and the diamond layer, respectively, have the following properties:

EXAMPLE 1

| Property | Value |
| --- | --- |
| Thickness | 1 μm |
| Crystallite size | 1.0 μm |
| Roughness $R_a$ | 0.1 μm |
| SP3 fraction | 97% |
| Maximum pore size | 0.4 mm |
| Pore distance | >40 mm |
| Maximum fissure length | 5 μm |
| Maximum fissure depth | 3 μm |
| Vickers hardness of the base body | 2600 HV |
| Defect density of the diamond coating | $<200 \times 10^{-9}$ |

The thickness of the diamond layer was here measured by means of a beta backscattering method. The crystallite size was measured by means of a light microscope with a 1000-fold magnification. The roughness $R_a$ was determined by means of a white-light interferometer and the SP3 fraction was determined by means of Raman spectroscopy. The pore sizes and the pore distances were determined by means of a light microscope and the fissure length and the fissure depth, respectively, by determining a fissure number distribution in an ion slope cutting through the base body 2, with the cut having a minimum cutting length of 1 mm. The hardness of the substrate was determined by means of a Vickers hardness test and the defect density by way of a light microscope, the defect density being defined as an area proportion of the non-coated defects of the substrate surface to the diamond-coated surface.

Hence, according to the invention it is possible to produce a homogeneous and permanent diamond coating with a thickness of less than 3 μm on the base surface by setting various parameters of the base body 2, which has so far not been possible in the prior art. A core aspect of the invention is here that the base body must be configured such that it is without fissures or comprises only fissures with a maximum length of less than or equal to 5 μm. In observing that parameter, it is then possible to perform a stable diamond coating with an extremely thin layer thickness of less than or equal to 4 mm, which leads to a significant reduction of the manufacturing costs since the coating period can be reduced to a few hours. Furthermore, it can thereby be avoided that the diamond layer will detach together with a part of the base layer. Thus, in avoiding large fissures, one also provides for a stable bond within the base layer. Furthermore, owing to the extremely thin diamond coating, it is possible to obtain seal rings with excellent properties, especially in terms of service life and emergency running properties. Thus particularly in the production of oil and natural gas the operating lives of seal rings which party last for only a few hours because of the severe operating conditions can be prolonged significantly. Furthermore, the diamond layer 3 also offers excellent protection from corrosion to the seal ring. Thanks to the idea according to the invention, viz. to reduce the fissure lengths on the surface of the base body and in the base body 2 itself, it is possible to obtain a diamond coating with a thickness of less than or equal to 4 μm. It is thereby possible for the first time that seal rings can be coated with a diamond layer also for normal applications, e.g. in series-produced pumps where the costs for the seal rings play a great role.

The invention claimed is:

1. A seal ring for a mechanical seal, comprising:
a base body with a diamond layer which is applied to a bond surface of the base body, wherein the diamond layer is configured as a sliding surface,
wherein the diamond layer has a thickness (D) which is less than or equal to 4 μm,
wherein the bond surface of the base body includes no fissure that has a maximum longitudinal extension (L) in the base body that is greater than 5 μm, and
wherein the bond surface of the base body includes no fissure that has a fissure depth (T) greater than 3 μm.

2. The seal ring according to claim 1, wherein the diamond layer has a thickness of at least 0.5 μm.

3. The seal ring according to claim 1, wherein the bond surface of the base body includes no pores.

4. The seal ring according to claim 1, wherein a crystallite size of the diamonds of the diamond layer is between 0.2-5 μm.

5. The seal ring according to claim 1, wherein the diamond layer has a roughness ($R_a$) of less than or equal to 0.2 μm.

6. The seal ring according to claim 1, wherein the diamond layer has an SP3 fraction of more than or equal to 97%.

7. The seal ring according to claim 1, wherein the base body has a Vickers hardness of more than or equal to 1400 HV.

8. The seal ring according to claim 1, wherein a defect density of the diamond layer is less than or equal to $200\times10^{-9}$, wherein the defect density is the ratio of the defect areas to the area of the surface that is coated without any defects.

9. The seal ring according to claim 1, wherein the base body includes at least one of silicon carbide (SiC) or tungsten carbide (WC).

10. The seal ring according to claim 1, wherein the surface of the diamond layer corresponds to a surface of the base body with a deviation of not more than +0.2 μm.

11. The seal ring according to claim 1, wherein the diamond layer has a thickness (D) which is less than or equal to 3 μm.

12. The seal ring according to claim 1, wherein the diamond layer has a thickness (D) which is less than or equal to 2 μm.

13. The seal ring according to claim 1, wherein the diamond layer has a thickness (D) which is about 1 μm.

14. The seal ring according to claim 1, wherein the bond surface of the base body includes only pores wherein the mean pore diameter of the pores is less than or equal to 0.4 mm.

15. The seal ring according to claim 1, wherein the bond surface of the base body includes only pores wherein the mean pore diameter of the pores is less than or equal to 0.3 mm.

16. The seal ring according to claim 1, wherein the bond surface of the base body includes only pores wherein the mean pore diamter of the pores is less than or equal to 0.2 mm.

17. The seal ring according to claim 1, wherein the bond surface of the base body includes only pores wherein the pores have a distance from one another of at least 100 times the mean pore diameter of the pores.

18. The seal ring according to claim 1, wherein a crystallite size of the diamonds of the diamond layer is between 0.2 to 4 μm.

19. The seal ring according to claim 1, wherein a crystallite size of the diamonds of the diamond layer is between 0.2 to 3 μm.

20. The seal ring according to claim 1, wherein a crystallite size of the diamonds of the diamond layer is between 0.2 to 2.5 μm.

21. The seal ring according to claim 1, wherein a crystallite size of the diamonds of the diamond layer is between 0.2 to 1 μm.

22. The seal ring according to claim 1, wherein the diamond layer has a roughness ($R_a$) of less than or equal to 0.15 μm.

23. The seal ring according to claim 1, wherein the diamond layer has a roughness ($R_a$) of less than or equal to 0.1 μm.

24. A seal ring for a mechanical seal, comprising:
a base body with a diamond layer which is applied to a bond surface of the base body, wherein the diamond layer is configured as a sliding surface,
wherein the diamond layer has a thickness (D) which is less than or equal to 4 μm, and
wherein the bond surface of the base body includes no fissure that has a maximum longitudinal extension (L) in the base body that is greater than 5 μm.

* * * * *